United States Patent
Hirayama et al.

(10) Patent No.: US 8,035,086 B2
(45) Date of Patent: Oct. 11, 2011

(54) ABERRATION CORRECTION APPARATUS THAT CORRECTS SPHERICAL ABERRATION OF CHARGED PARTICLE APPARATUS

(75) Inventors: Yoichi Hirayama, Hitachinaka (JP); Takaho Yoshida, Higashimatsuyama (JP)

(73) Assignees: Hitachi, Ltd., Tokyo (JP); Okinawa Institute of Science and Technology Promotion Corporation, Okinawa (JP)

( * ) Notice: Subject to any disclaimer, the term of this patent is extended or adjusted under 35 U.S.C. 154(b) by 410 days.

(21) Appl. No.: 12/379,442

(22) Filed: Feb. 23, 2009

(65) Prior Publication Data

US 2009/0230317 A1    Sep. 17, 2009

(30) Foreign Application Priority Data

Mar. 13, 2008 (JP) ................................. 2008-064717

(51) Int. Cl.
*H01J 3/24* (2006.01)
(52) U.S. Cl. ........ 250/396 R; 250/396 ML; 369/112.23; 369/112.24; 369/112.26; 359/388; 359/646; 359/672
(58) Field of Classification Search ............. 250/396 R, 250/396 ML; 369/112.23, 112.24, 112.26, 369/44.23, 44.24; 359/362, 380, 383, 384, 359/388, 414, 416–418, 422, 423, 432, 434, 359/642, 644–646, 649–651, 656–661, 671, 359/672, 754–756, 823
See application file for complete search history.

(56) References Cited

U.S. PATENT DOCUMENTS

| 4,962,313 | A  | * | 10/1990 | Rose .............................. 250/311 |
| 5,084,622 | A  | * | 1/1992  | Rose ......................... 250/396 R |
| 6,605,810 | B1 | * | 8/2003  | Haider et al. ............. 250/396 R |
| 6,770,887 | B2 | * | 8/2004  | Krivanek et al. .......... 250/396 R |
| 7,619,836 | B2 | * | 11/2009 | Minakawa et al. ........... 359/794 |
| 2009/0242786 | A1 | * | 10/2009 | Yoshida et al. ........... 250/396 R |

FOREIGN PATENT DOCUMENTS

| JP | 3-295140 A   | 8/1990 |
| JP | 2002-510431  | 8/1998 |
| JP | 2002-510431  | 4/2002 |
| JP | 2002-216689  | 8/2002 |
| JP | 2007-242514  | 9/2007 |
| WO | WO 99/38188  | 8/1998 |

OTHER PUBLICATIONS

Office Action from Japanese Patent Office in the corresponding Japanese Application No. 2008-064717, mailed Mar. 2, 2010 in Japanese and English.

* cited by examiner

*Primary Examiner* — Bernard E Souw
(74) *Attorney, Agent, or Firm* — Stites & Harbison PLLC; Juan Carlos A. Marquez, Esq.

(57) ABSTRACT

To provide an aberration correction configuration that can realize both an aberration correction function for a long focus and an aberration correction function for a short focus. While having a conventional aberration correction apparatus configuration that has two rotationally symmetric lenses arranged between two multipole lenses, three rotationally symmetric lenses are disposed between an objective lens and a multipole lens instead of the conventional arrangement in which two rotationally symmetric lenses are disposed therebetween. When using the objective lens with a long focal length, aberrations are corrected using two rotationally symmetric lenses among three rotationally symmetric lenses disposed between the objective lens and the multipole lens. When using the objective lens with a short focal length, e.g. for high resolution observation, aberrations are corrected using two rotationally symmetric lenses of a different combination to those used for a long focus, among the three rotationally symmetric lenses disposed between the objective lens and the multipole lens. (See FIG. 3)

9 Claims, 4 Drawing Sheets

ABERRATION CORRECTION APPARATUS THAT CORRECTS SPHERICAL ABERRATION OF CHARGED PARTICLE APPARATUS

CLAIM OF PRIORITY

The present application claims priority from Japanese patent application JP2008-064717 filed on Mar. 13, 2008, the content of which is hereby incorporated by reference into this application.

BACKGROUND OF THE INVENTION

1. Field of the Invention

The present invention relates to an aberration correction apparatus and a charged particle apparatus, and more particularly to an optical system for correcting a spherical aberration of an objective lens, of a charged particle beam microscope typified by a transmission electron microscope with, for example, an aberration correction apparatus including multipole lenses and rotationally symmetric lenses.

2. Background Art

An electron lens that uses an electric field or a magnetic field to converge electron beams is essential in an electron microscope such as a scanning electron microscope (SEM), a transmission electron microscope (TEM), or a scanning transmission electron microscope (STEM). A lens that acts as a spherical lens using a rotationally symmetric electromagnetic field is most often used as an electron lens. It is known that a positive spherical aberration is unavoidable with this kind of rotationally symmetric electron lens. In this case, since it is not possible to create a negative spherical aberration even by using another rotationally symmetric electron lens, spherical aberration correction can not be performed by using a set of concave/convex lenses in optics, and in the conventional electron microscope apparatuses spherical aberration is a principal factor in deciding the substantial resolution.

Meanwhile, it has been indicated that the spherical aberration of an electron lens can be corrected in theory by a combination of non-rotationally symmetric multipole lenses. However, the structure of these multipole correctors is complex since the structures use multiple stages of four poles, six poles, eight poles, or the like.

One known aberration correction apparatus corrects the spherical aberration of a rotationally symmetric lens by generating a hexapole field with a multipole lens. The principle of the spherical aberration correction is as follows. With respect to a positive spherical aberration of a common objective lens, a negative spherical aberration is produced by generating a hexapole field with a multipole lens to thereby cancel out the spherical aberration of the objective lens. Further, since the negative spherical aberration can be controlled by changing the strength of the hexapole field, the spherical aberration of the lenses mounted in the electron microscope, that is, the entire optical system including an objective lens, converging lens, projection lens and the like, can be controlled to an arbitrary amount. However, the hexapole field generates a secondary aberration, and therefore the secondary aberration of the hexapole field can be cancelled out by arranging two rotationally symmetric lenses between two multipole lenses and inverting the trajectory of the electron beam between the multipole lenses.

Figure 1:
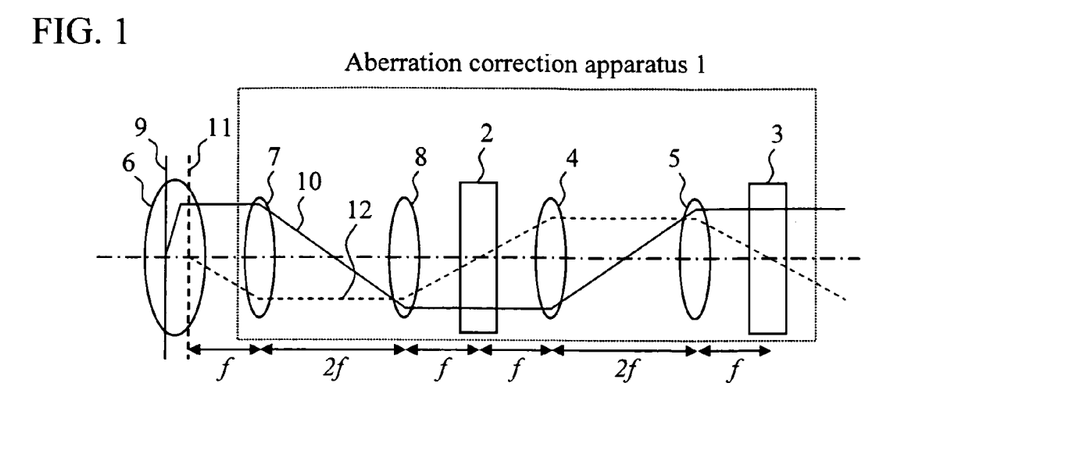
FIG. 1 is a schematic diagram that illustrates the disposition of lenses and the trajectory of electron beams in a conventional aberration correction apparatus that uses multipole lenses and rotationally symmetric lenses.

For example, technology disclosed in JP Patent Publication (Kokai) No. 3-295140 A (1991) (hereunder, referred to as "Patent Document 1") relates to an apparatus that corrects the spherical aberration of a rotationally symmetric lens of an electron microscope of this kind. FIG. 1 is a schematic diagram that illustrates that technology. In FIG. 1, although each electron lens is illustrated as an optical lens, this is done to simplify the diagrammatic representation, and in fact the lenses are electron lenses that use a magnetic field.

In the correction apparatus, rotationally symmetric lenses 4 are 5 are arranged between multipole lenses 2 and 3, and rotationally symmetric lenses 7 and 8 are arranged between a multipole lens 2 and an objective lens 6. The focal lengths of the rotationally symmetric lens are all the same length f. A distance between the rotationally symmetric lenses 7 and 8 is 2 f, and a distance from the multipole lens 2 to each of the rotationally symmetric lenses 4 and 8 is f. Further, a distance between the rotationally symmetric lenses 4 and 5 is 2 f, and a distance between the multipole lens 3 and the rotationally symmetric lens 5 is f. Conventionally, when performing high resolution observation with an electron microscope, a specimen position 9 exists inside an objective lens 6, and an extremely strong excitation of several mm is used as the focal length of the objective lens 6. An axial trajectory 10 is an electron beam trajectory that passes an intersection point between the specimen and the optical axis and that has a certain angle with respect to the optical axis, and is incident onto the multipole lens 2 in parallel with the optical axis. Thereafter, the trajectory is inverted by the rotationally symmetric lenses 4 and 5, and is incident on the multipole lens 3 in parallel with the optical axis (spherical aberration correction condition). When the multipole lenses 2 and 3 and the rotationally symmetric lenses 4 and 5 are arranged as described above, the axial trajectory 10 passes through the multipole lenses 2 and 3 in a condition in which the axial trajectory 10 is separated by the same distance from the optical axis (spherical aberration correction condition). Since the strength of a hexapole field is decided by the distance from the optical axis, a secondary aberration can be cancelled out by making the excitation of the two multipole lenses the same. More specifically, by applying a spherical aberration of opposite sign and half the amount with respect to the spherical aberration of the objective lens 6 with the respective hexapole fields of the two multipole lenses, the spherical aberration of the objective lens can be corrected while cancelling out the secondary aberration.

The aberration correction apparatus shown in FIG. 1 has a configuration for correcting an axial coma aberration. A rotationally symmetric lens has a plane without an axial coma aberration, and the plane is called a "coma-free plane". Since the coma-free plane normally exists in the vicinity of a back focal plane of the rotationally symmetric lens, in a case in which the specimen position 9 is arranged inside the objective lens 6 and high resolution observation of the objective lens 6 is performed using a strong excitation, a coma-free plane 11 of the objective lens 6 exists at a position that is several mm behind the objective lens 6. Assuming that the distance between the coma-free plane 11 of the objective lens 6 and the rotationally symmetric lens 7 is f, the coma-free plane 11 can be transferred to the coma-free plane of the rotationally symmetric lens 7.

According to the configuration shown in FIG. 1, the coma-free plane 11 can be transferred to the coma-free plane of the rotationally symmetric lenses 8, 4, and 5 according to the same principle. The coma aberration of a multipole lens has trajectory that passes through the center of the multipole lens, and the coma aberration can be cancelled out by the trajectory becoming symmetrical at the center between the two multipole lenses 2 and 3. In FIG. 1, an off-axis trajectory 12 that passes through the coma-free plane 11 of the objective lens 6 passes through the center of the multipole lenses 2 and 3, and by the trajectory being made symmetrical at the center between the two multipole lenses 2 and 3, the coma-free plane is transferred to correct the axial coma aberration.

According to the configuration of FIG. 1 described above, a spherical aberration correction apparatus is provided in which a spherical aberration correction condition (beam is incident in parallel with the optical axis with respect to the multipole lenses 2 and 3, and the beam is symmetrical (distance from optical axis is the same) at multipole lenses 2 and 3) is satisfied by the axial trajectory 10 between the multipole lenses 2 and 3 that are the latter half portion of the correction apparatus, and a coma-free plane transfer condition is satisfied by the off-axis trajectory 12 between the objective lens 6 and the multipole lens 2 that are the front half portion of the correction apparatus.

Figure 2:
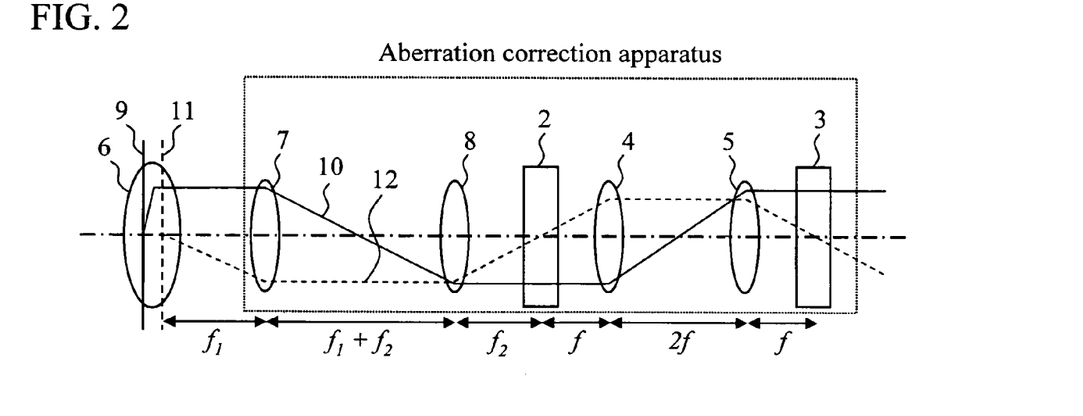
FIG. 2 is a schematic diagram that illustrates the disposition of lenses and the trajectory of electron beams in a conventional aberration correction apparatus that uses multipole lenses and rotationally symmetric lenses that is different from the aberration correction apparatus shown in FIG. 1.

JP Patent Publication (Kohyo) No. 2002-510431 A (hereunder, referred to as "Patent Document 2") discloses technology for correcting a spherical aberration using a different configuration. FIG. 2 is a schematic diagram that illustrates that technology. The apparatus in FIG. 2 is also an aberration correction apparatus for high resolution observation in which the specimen position 9 is inside the objective lens 6, similarly to FIG. 1. Although the configuration between the multipole lenses 2 and 3 as the latter half portion of the correction apparatus is the same as that shown in FIG. 1, the configuration between the objective lens 6 and the multipole lens 2 as the front half portion of the correction apparatus is different to that shown in FIG. 1.

In FIG. 2, the focal lengths of the rotationally symmetric lenses 7 and 8 are assumed to be $f_1$ and $f_2$, respectively. The distance between the coma-free plane 11 of the objective lens 6 and the rotationally symmetric lens 7 is assumed to be $f_1$, the distance between the rotationally symmetric lenses 7 and 8 is assumed to be $f_1+f_2$, and the distance from the rotationally symmetric lens 8 to the multipole lens 2 is assumed to be $f_2$. Since the latter half portion of the correction apparatus has the same configuration as that in FIG. 1 described above, the axial trajectory 10 satisfies the spherical aberration correction condition by the same principle. Further, although the configuration of the front half portion of the correction apparatus is different to the configuration shown in FIG. 1, by disposing the rotationally symmetric lenses 7 and 8 at the positions of the focal lengths, the off-axis trajectory 12 satisfies the coma-free plane transfer condition.

As a feature of the aberration correction apparatus shown in FIG. 2, the ease with which a spherical aberration can be finely adjusted may be mentioned. Since the spherical aberration and coma-free plane 11 of the objective lens 6 change when the focal length of the objective lens 6 is changed, according to the configuration shown in FIG. 1 it is necessary to adjust the focal length f of all the rotationally symmetric lenses. However, with the configuration shown in FIG. 2, when finely adjusting a spherical aberration correction of the objective lens 6, since the position of the axial trajectory 10 passing through the multipole lens 2 does not change when focal lengths $f_1$ and $f_2$ of the rotationally symmetric lenses 7 and 8 are finely adjusted, the spherical aberration can be corrected without changing the focal length f of the rotationally symmetric lenses 4 and 5 and the excitation of the multipole lenses 2 and 3. Hence, according to the configuration shown in FIG. 2, the spherical aberration correction condition and coma-free plane transfer condition can be satisfied by finely adjusting the positions and focal lengths $f_1$ and $f_2$ of the rotationally symmetric lenses 7 and 8, and the advantage that fine adjustment of a spherical aberration correction can be performed with ease can be expected. Further, since the focal length can be adjusted according to the configuration shown in FIG. 2, in comparison to the configuration shown in FIG. 1, the configuration shown in FIG. 2 allows greater flexibility and, for example, also enables magnification of an image.

SUMMARY OF THE INVENTION

As described above, a conventional spherical aberration correction apparatus is a correction apparatus for high resolution observation in which the specimen position 9 is inside the objective lens 6, and the configurations shown in FIGS. 1 and 2 also follow the conventional configuration.

However, although the specimen is placed inside the objective lens in both configurations in FIGS. 1 and 2, if the specimen can be placed outside the objective lens the degree of flexibility of the specimen observation conditions can be expanded. For example, when performing a magnetic observation of a magnetic specimen, normally the specimen is disposed within an objective lens and is observed using a projection lens or the like underneath the objective lens, without using the objective lens itself. However, because the excitation of a projection lens or the like used for image formation is small, it is difficult to observe the magnetic properties of the specimen at a high resolution. Alternatively, there is also an observation method in which a magnetic field of the objective lens is imparted to the specimen. However, in that case the magnetic field can only be applied in one direction. In this kind of magnetic observation of a magnetic specimen, by placing the specimen at a location at which there is no influence from the magnetic field of the objective lens it is possible to form an image using the objective lens, and a projection lens or the like located thereunder can be used as a magnifying system. Further, although some degree of specimen space is required, by placing the specimen inside a magnetic field application apparatus it is possible to apply a magnetic field in an arbitrary direction to the specimen. In the case of placing a specimen inside an objective lens, since the specimen and an apparatus that applies conditions to the specimen must be housed in a limited space, the conditions that can be applied to the specimen are limited. Further, in the case of performing observation in conditions in which the temperature or pressure of a specimen is changed, by disposing the specimen outside the objective lens it is possible to perform observation under a variety of conditions.

However, when disposing the specimen outside the objective lens, the focal length of the objective lens must be used in a long state (long focus). Generally, when the focal length is long, the spherical aberration becomes extremely large. This will also be understood from the fact that the relationship between a spherical aberration coefficient Cs and a focal length f is generally represented as shown in expression (1).

[Expression 1]

$$Cs = 5\frac{f^3}{(S+D)^2} \qquad (1)$$

Here, S and D represent the polepiece gap and bore diameter, respectively.

Since the spherical aberration increases when the specimen is disposed outside the objective lens in this way, there is the problem that the specimen cannot be adequately observed. Accordingly, a spherical aberration correction apparatus for a long focus that corresponds to a case in which the focal length of an objective lens is long is required.

With the conventional configurations as disclosed in Patent Documents 1 and 2 (FIG. 1 or FIG. 2), in a case in which the specimen position 9 is disposed outside the objective lens 6 and the objective lens 6 is used with a long focus, the coma-free plane 11 of the objective lens 6 exists in the vicinity of the back focal plane of the objective lens. Therefore, the coma-free plane 11 exists behind the rotationally symmetric lens 7, and the off-axis trajectory 12 that transfers the coma-free plane 11 to the center of the multipole lens 2 can not be formed. Accordingly, when the specimen position is disposed outside the objective lens in the apparatuses disclosed in Patent Documents 1 and 2, the axial trajectory 10 that satisfies the spherical aberration correction condition and the off-axis trajectory 12 that satisfies the coma-free plane transfer condition cannot be formed simultaneously.

In a case where an objective lens uses a short focus, although high resolution observation of a specimen is possible because there is low spherical aberration, since the specimen must be placed inside the objective lens the degree of observational flexibility is limited, as the objective lens using a short focus is not suitable for observation of a magnetic material and it is not possible to perform observation of a specimen that is too large to be placed inside the objective lens and the like. In contrast, in the case of an objective lens using a long focus, although the objective lens is not adequate for high resolution observation of a specimen in comparison to the case of a short focus since the spherical aberration is large, there is a high degree of observation flexibility because observation of a magnetic material can be appropriately performed since the magnetic material is not influenced by the magnetic field of the objective lens and the size of a specimen is also not limited.

The present invention has been made in consideration of the above described circumstances, and an object of the invention is to provide an aberration correction configuration that can realize both an aberration correction function for a long focus and an aberration correction function for a short focus.

First, to realize an aberration correction function for a long focus, in an aberration correction apparatus according to the present invention, in addition to the conventional configuration in which two rotationally symmetric lenses are arranged between two multipole lenses and two lenses are arranged between an objective lens and a multipole lens, a length between the objective lens and a rotationally symmetric lens is made longer than a focal length of the objective lens at a time of use with a long focus. As a result, the condition of the off-axis trajectory 12 that transfers a coma-free plane is satisfied, and the condition of the axial trajectory 10 that corrects the above described spherical aberration is also satisfied at the same time.

Further, in order to obtain both an aberration correction function for a long focus and an aberration correction function for a short focus with a single configuration, in the aberration correction apparatus according to the present invention, although a configuration in which two rotationally symmetric lenses are arranged between two multipole lenses is the same as in the conventional aberration correction apparatus, the conventional configuration in which two rotationally symmetric lenses are arranged between the objective lens and a multipole lens is changed to a configuration in which three rotationally symmetric lenses are arranged between the objective lens and a multipole lens. In the case of using the objective lens when a focal length is long, an aberration is corrected by using two lenses among the three rotationally symmetric lenses that are arranged between the objective lens and the multipole lens. Further, in the case of using the objective lens when a focal length is short, such as for high resolution observation, an aberration is corrected by using a combination of two rotationally symmetric lenses that are different to the two lenses used in the case of a long focus among the three rotationally symmetric lenses arranged between the objective lens and the multipole lens.

More specifically, an aberration correction apparatus according to the present invention is an apparatus for correcting an aberration of an objective lens in a charged particle beam apparatus, comprising: a first multipole lens (multipole lens 2) that is arranged on an objective lens 6 side; a second multipole lens (multipole lens 3) that is arranged on a projection lens side; a first transfer lens group (rotationally symmetric lenses 4 and 5) for transferring a coma-free condition of the objective lens to the second multipole lens, that is arranged between the first multipole lens and the second multipole lens; and a second transfer lens group (rotationally symmetric lenses 7, 8 and 13) for transferring a coma-free condition of the objective lens to the first multipole lens, that is arranged between the first multipole lens and the objective lens. The second transfer lens group includes three rotationally symmetric lenses, and when the three rotationally symmetric lenses are defined as a first, a second, and a third rotationally symmetric lens in order of proximity to the objective lens, it is possible to correct an aberration of the objective lens in a case in which a focus of the objective lens is inside or outside the objective lens by using the second transfer lens group while switching between a combination of the third rotationally symmetric lens (rotationally symmetric lens 8) and the first rotationally symmetric lens (rotationally symmetric lens 13) and a combination of the third rotationally symmetric lens (rotationally symmetric lens 8) and the second rotationally symmetric lens (rotationally symmetric lens 7).

Here, in a case in which the focus of the objective lens is outside the objective lens (when the objective lens uses a long focus), an aberration correction of the objective lens is performed using a combination of the second and third rotationally symmetric lenses. In contrast, in a case in which the focus of the objective lens is inside the objective lens (when the objective lens uses a short focus), an aberration correction of the objective lens is performed using a combination of the first and third rotationally symmetric lenses. More specifically, when the objective lens uses a long focus, conditions that enable an aberration correction of the objective lens are that an axial trajectory intersects with an optical axis between the second and third rotationally symmetric lenses without the axial trajectory intersecting with the optical axis between the objective lens and the second rotationally symmetric lens, and an off-axis trajectory does not intersect with the optical axis between the second and third rotationally symmetric lenses. Further, when the objective lens uses a short focus, conditions that enable an aberration correction of the objective lens are that an axial trajectory intersects with an optical axis between the first and third rotationally symmetric lenses without the axial trajectory intersecting with the optical axis between the objective lens and the first rotationally symmetric lens, and an off-axis trajectory does not intersect with the optical axis between the first and the third rotationally symmetric lenses.

According to the configuration that can perform aberration correction for a long focus as described above, in a case in which the specimen position 9 is disposed inside the objective lens 6 and the objective lens is used with a short focus, the condition of the axial trajectory 10 that corrects a spherical aberration and the condition of the off-axis trajectory 12 that transfers the coma-free plane 11 can both be satisfied. Although at this time the axial trajectory 10 is incident in parallel with the optical axis with respect to the multipole lenses 2 and 3, the trajectory passes through the vicinity of the optical axis. Among hexapole fields that a multipole lens generates, because the influence of a magnetic field is stronger for a field that is located far from the optical axis, in order to correct a spherical aberration it is necessary to make the excitation of hexapole fields produced by a multipole lens extremely strong and strengthen the influence of the hexapole fields as far as the optical axis vicinity. Symmetry and stability are required for hexapole fields. Of these, stability is decided by the power source specifications, and the stability deteriorates unless the power source output is large. When performing aberration correction for a long focus with the above described configuration, a low output and a high stability are required for the power source of the multipole lens. However, when performing aberration correction for a short focus, a high output and a low stability are required. More specifically, since the required power source specifications are different, it is necessary to provide two kinds of power sources. Although a high output/high stability power source is necessary as one alternative, currently there is not a power source that satisfies the requirement. Accordingly, although a configuration that can suppress the strength of a hexapole field is necessary when performing aberration correction for a short focus, it is desirable to avoid significantly changing the aberration correction configuration for a long focus.

Thus, according to the present invention a rotationally symmetric lens 13 is newly added between the objective lens 6 and the rotationally symmetric lens 7, and by using the added rotationally symmetric lens 13 and the rotationally symmetric lens 8 when performing high resolution observation, without using the rotationally symmetric lens 7, an aberration is also corrected in a case in which the focal length of the objective lens is short. Although a spherical aberration and a coma aberration can be corrected when simultaneously satisfying the conditions regarding the axial trajectory 10 and the off-axis trajectory 12, when these two aberrations are sufficiently small the influence of a chromatic aberration increases. According to the present invention, the position of a rotationally symmetric lens between an objective lens and a multipole lens can be arranged so that the influence of a chromatic aberration is small.

In this connection, the present invention also provides a charged particle apparatus that is equipped with an aberration correction apparatus including the above described configuration.

Other features of the present invention will become apparent from the description of the preferred embodiments of the invention and the attached drawings.

According to the present invention, by using two different combinations of lenses among three rotationally symmetric lenses arranged between an objective lens and a multipole lens, it is possible to perform spherical aberration correction not only in a case of magnetic observation or the like in which a specimen is disposed outside the objective lens and the objective lens is used with a long focal length, but also in a case of high resolution observation in which a specimen is disposed inside the objective lens and the objective lens is used with a short focal length.

DESCRIPTION OF SYMBOLS

1: correction apparatus; 2, 3: multipole lens; 4, 5: rotationally symmetric lens; 6: objective lens; 6a: range of influence of magnetic field of objective lens; 7, 8: rotationally symmetric lens; 9: specimen position at time of high resolution observation; 10: axial trajectory at time of high resolution observation; 11: coma-free plane at time of high resolution observation; 12: off-axis trajectory that passes through coma-free plane at time of high resolution observation; 13: newly added rotationally symmetric lens; 14: specimen position when using objective lens with long focus; 14a: specimen space; 15: axial trajectory when using objective lens with long focus; 16: coma-free plane when using objective lens with long focus; 17: off-axis trajectory that passes through coma-free plane when using objective lens with long focus; 18: electron source; 19: first converging lens; 20: second converging lens; 21: first projection lens; 22: second projection lens; 23: fluorescent screen; 24 to 31: current source; 32: computing machine

DETAILED DESCRIPTION OF THE PREFERRED EMBODIMENTS

Hereunder, an embodiment of the present invention is described with reference to the attached drawings. However, this embodiment is merely one example for implementing the present invention, and it should be noted that the present embodiment does not limit the technical scope of the present invention. Common components are denoted by the same reference numerals in the drawings. Further, although the present embodiment describes a case in which a TEM is used as a charged particle beam apparatus, the present invention is not limited thereto.

<Configuration of Aberration Correction Apparatus>

Figure 3:
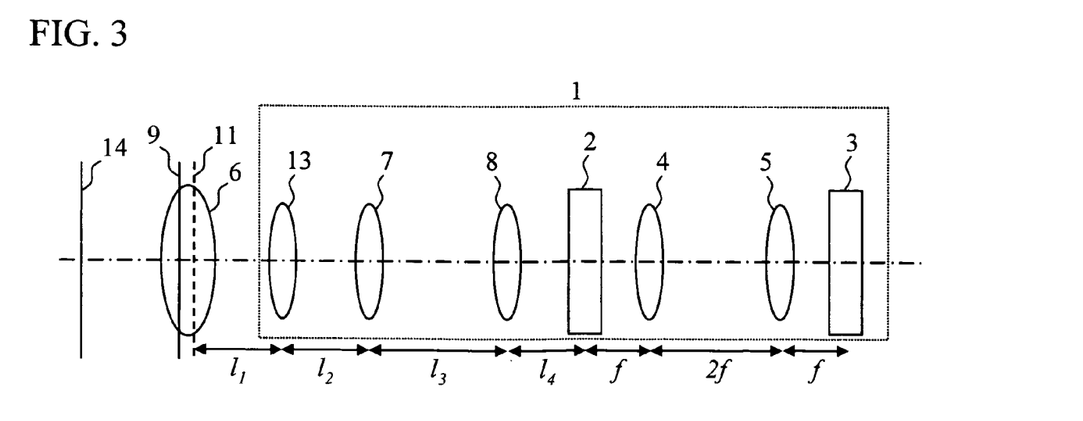
FIG. 3 is a schematic diagram that illustrates the overall disposition of lenses of the aberration correction apparatus of the present invention.

FIG. 3 shows the schematic configuration of an aberration correction apparatus according to an embodiment of the present invention. As shown in FIG. 3, in an aberration correction apparatus 1, rotationally symmetric lenses 4 and 5 are arranged between multipole lenses 2 and 3, and three rotationally symmetric lenses 7, 8, and 13 are arranged between an objective lens 6 and a multipole lens 2. The focal length of each of the rotationally symmetric lenses 4 and 5 is f, a distance between the multipole lens 2 and the rotationally symmetric lens 4 and a distance between the multipole lens 3 and the rotationally symmetric lens 5 is f, respectively, and a distance between the rotationally symmetric lenses 4 and 5 is 2 f. When performing high resolution observation, the length between the coma-free plane 11 of the objective lens 6 and the rotationally symmetric lens 13, the length between the rotationally symmetric lenses 13 and 7, the length between the rotationally symmetric lenses 7 and 8, and the length between the rotationally symmetric lens 8 and the multipole lens 2 are taken as $l_1$, $l_2$, $l_3$, and $l_4$, respectively. When using the objective lens with a long focus, such as for magnetic observation or the like, the specimen position is outside the objective lens, as illustrated by a specimen position 14. Further, devices that are not principal devices for the description of the present invention, such as an aperture device for limiting a beam divergence angle or a deflector that adjusts the trajectory of a beam, are omitted from FIGS. 3 to 5.

Figure 4:
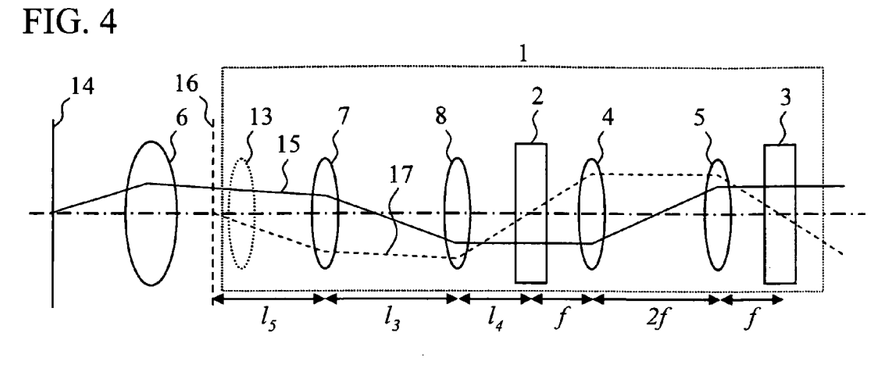
FIG. 4 is a schematic diagram that illustrates the disposition of lenses and the trajectory of electron beams in a case in which an observation specimen is outside the objective lens (case of a long focus).

FIG. 4 illustrates a configuration that implements an aberration correction function for a long focus that corrects an aberration when using the objective lens 6 with a long focus in a case in which the specimen position 14 is outside the objective lens 6, i.e. for magnetic observation of the like. Of the three rotationally symmetric lenses between the objective lens 6 and the multipole lens 2, the rotationally symmetric lenses 7 and 8 are used, and the rotationally symmetric lens 13 is not used (a current is not passed thereto). In this case, a length between a coma-free plane 16 and the rotationally symmetric lens 7 when using the objective lens 6 with a long focus is taken to be $l_5$.

Further, as shown in FIG. 4, an axial trajectory 15 having a certain angle with respect to the optical axis from an intersection point of the optical axis and the specimen 14 is incident in parallel with the optical axis with respect to the multipole lenses 2 and 3. By the beam being incident on the multipole lenses 2 and 3 in this manner, the aforementioned condition for correcting spherical aberration can be satisfied. Further, an off-axis trajectory 17 that passes through the coma-free plane 16 when using the objective lens 6 with a long focus forms a trajectory that is projected onto the center of the multipole lenses 2 and 3. By adopting this configuration, the aforementioned condition for transferring a coma-free plane can be satisfied. Although there are several solutions with regard to the focal length and positions of the rotationally symmetric lenses 7 and 8 in order for the axial trajectory 15 and the off-axis trajectory 17 to simultaneously satisfy the above described conditions, because the influence of a chromatic aberration increases when correcting a spherical aberration and an axial coma aberration, it is desirable to set the positions and focal lengths of the rotationally symmetric lenses 7 and 8 so that the chromatic aberration decreases. At that time, it is necessary to satisfy the condition that the coma-free plane 16 when using the objective lens 6 with a long focus exists in front of the rotationally symmetric lens 7, and the axial trajectory 15 from the specimen position 14 does not create a crossover between the objective lens 6 and the rotationally symmetric lens 7. Therefore, since the coma-free plane 16 when using the objective lens 6 with a long focus exists in the vicinity of the back focal plane of the objective lens 6, $l_5$ must be made longer than the focal length of the objective lens 6. Since correction of a spherical aberration is performed by adjusting the excitation of the multipole lenses and controlling the spherical aberration using the strength of hexapole fields, similarly to a conventional spherical aberration corrector, the focal lengths of the rotationally symmetric lenses 4 and 5 are not changed. In order to satisfy the condition of the off-axis trajectory 17 that transfers the coma-free plane 16, the focal lengths of the rotationally symmetric lenses 7 and 8 are adjusted and the positions of the rotationally symmetric lenses 7 and 8 are not changed.

In the case of the configuration of the conventional aberration correction apparatuses as shown in FIGS. 1 and 2, since the coma-free plane exists in the vicinity of the back focal plane of the rotationally symmetric lens as described above, by adjusting the focal lengths of the rotationally symmetric lenses 7 and 8 and the length between the lenses, the coma-free plane 11 of the objective lens 6 can be transferred to the respective coma-free planes of the rotationally symmetric lenses 7, 8, 4 and 5. However, in practice, adjusting the positions of the rotationally symmetric lenses 7 and 8 is difficult due to problems relating to the positional accuracy and the structure of the electron microscope. It is therefore desirable to perform transfer of the coma-free plane by adjusting only the focal lengths of the rotationally symmetric lenses 7 and 8.

Thus, according to the present configuration, instead of transferring the coma-free plane 16 of the objective lens 6 to the coma-free plane of the rotationally symmetric lenses 7 and 8, by cancelling out the axial coma aberration of the objective lens 6 using the axial coma aberration of the rotationally symmetric lenses 7 and 8, it appears like the coma-free plane 16 of the objective lens 6 is transferred. Although conventionally the rotationally symmetric lenses 7 and 8 must be disposed at the positions of the focal lengths thereof, according to the present configuration the positions of the rotationally symmetric lenses 7 and 8 can be decided with a certain degree of flexibility, and an axial coma aberration is corrected by adjusting the focal lengths of the rotationally symmetric lenses 7 and 8.

As described above, the focal lengths of the rotationally symmetric lenses 7 and 8 must be set so as to satisfy the condition of the off-axis trajectory 17 that transfers the coma-free plane and also simultaneously satisfy the condition of the axial trajectory 15 that corrects the spherical aberration.

Figure 5:
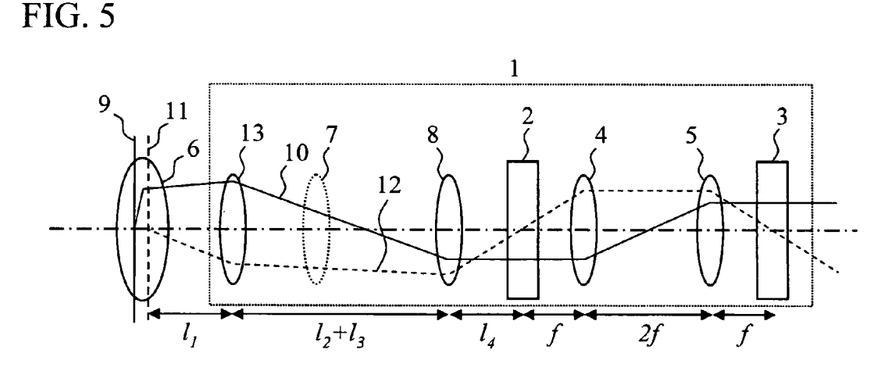
FIG. 5 is a schematic diagram that illustrates the disposition of lenses and the trajectory of electron beams in a case in which an observation specimen is inside the objective lens (case of a short focus).

FIG. 5 is a view that illustrates a configuration that implements an aberration correction function for a short focus in a case in which the specimen position 9 is inside the objective lens 6, that is, a case in which the objective lens is used with a short focus, such as when performing high resolution observation. When implementing an aberration correction function for a short focus, among the three rotationally symmetric lenses arranged between the objective lens 6 and the multipole lens 2, the rotationally symmetric lenses 13 and 8 are used, and the rotationally symmetric lens 7 is not used (a current is not passed thereto).

In FIG. 5, an axial trajectory 10 having a certain angle with respect to the optical axis from an intersection point between the specimen and the optical axis is a trajectory that is incident in parallel with the optical axis with respect to the multipole lenses 2 and 3. Hence, the aforementioned condition for correcting a spherical aberration is satisfied. Further, an off-axis trajectory 12 that passes through the coma-free plane 11 when using the objective lens 6 with a short focus forms a trajectory that is projected onto the center of the multipole lenses. Hence, the aforementioned condition for transferring a coma-free plane is also satisfied.

Similarly to the case of the aberration correction apparatus for a long focus described above, by cancelling out the axial coma aberration of the objective lens 6 using the axial coma aberration of the rotationally symmetric lenses 13 and 8, it appears like the coma-free plane 11 of the objective lens 6 is transferred. Although there are several solutions with regard to the position of the rotationally symmetric lens 13 and the focal lengths of the rotationally symmetric lenses 13 and 8 in order for the axial trajectory 10 and the off-axis trajectory 12 to simultaneously satisfy the above described conditions, because the influence of a chromatic aberration increases when correcting a spherical aberration and a coma aberration, it is desirable to set the position of the rotationally symmetric lens 13 and the focal lengths of the rotationally symmetric lenses 13 and 8 so that the chromatic aberration decreases. The position of the rotationally symmetric lens 8 is set to the same position as in the case of the aberration correction apparatus for a long focus. At this time, it is necessary to satisfy the condition that the coma-free plane 11 when using the objective lens 6 with a short focus exists in front of the rotationally symmetric lens 13, and the axial trajectory 10 from the specimen position 9 does not create a crossover other than at the specimen position 9 between the objective lens 6 and the rotationally symmetric lens 13. Since correction of a spherical aberration is performed by adjusting the excitation of the multipole lenses and controlling the spherical aberration using the strength of a hexapole field, similarly to a conventional spherical aberration corrector, the focal lengths of the rotationally symmetric lenses 4 and 5 are not changed. To transfer the coma-free plane 16, the focal lengths of the rotationally symmetric lenses 13 and 8 are adjusted, and the positions of the rotationally symmetric lenses 13 and 8 are not changed.

<Discussion Regarding Aberration Correction Conditions>

Figure 6:
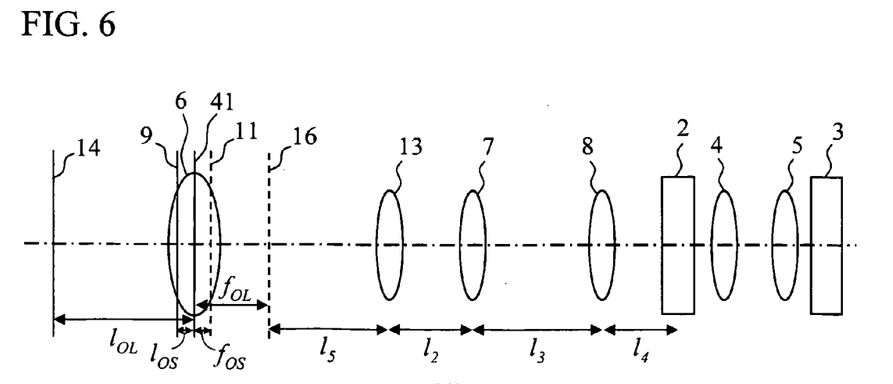
FIG. 6 is a view that illustrates the positional relationship between an aberration correction optical system and a coma-free plane.
Figure 7:
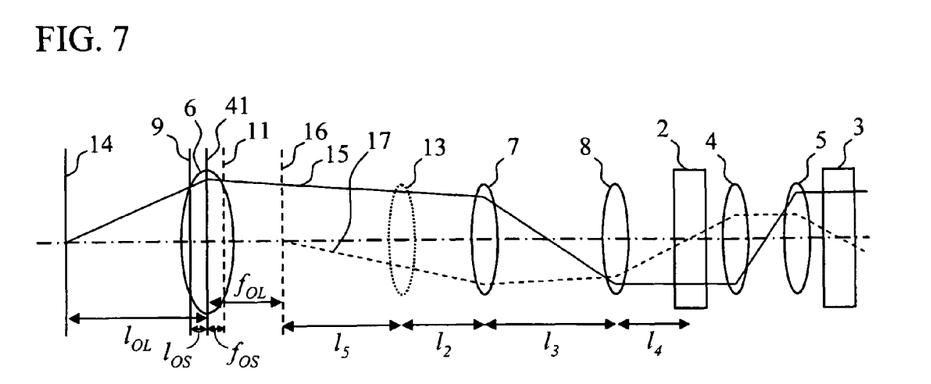
FIG. 7 is a view for describing aberration correction conditions in the case of a long focus.
Figure 8:
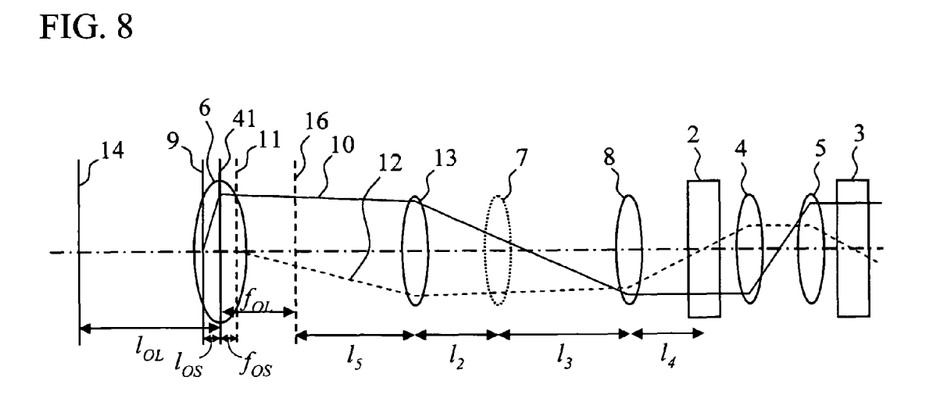
FIG. 8 is a view for describing aberration correction conditions in the case of a short focus.

Next, the aberration correction conditions, that is, the relationship between the disposition and focus of each lens, are discussed using FIGS. 6 to 8.

FIG. 6 is a schematic diagram that shows the overall disposition of lenses of the aberration correction apparatus 1 according to the embodiment of the present invention, and is approximately the same as FIG. 3. In this case, reference numeral 41 denotes the position of a principal plane of the objective lens 6. Further, a coma-free plane (plane on which a coma aberration is 0) exists in the vicinity of the back focal plane of the objective lens 6.

Accordingly, when a focal length in the case of using the objective lens with a short focus is taken as $f_{OS}$ and a focal length in the case of using the objective lens with a long focus is taken as $f_{OL}$, a length from the principal plane 41 of the objective lens as far as the coma-free plane 11 at the time of high resolution observation is $f_{OS}$ and a length from the principal plane 41 of the objective lens as far as the coma-free plane 16 when using the objective lens with a long focus is $f_{OL}$. Hence, $l_1$ in FIG. 3 is represented as $l_1 = l_5 + F_{OL} - f_{OS}$. Further, the length from the specimen position 9 at the time of high resolution observation to the principal plane 41 of the objective lens is taken to be $l_{OS}$, and the length from the specimen position 14 when using the objective lens with a long focus to the principal plane 41 of the objective lens is taken to be $l_{OL}$. Further, the focal lengths of the rotationally symmetric lenses 7, 8, and 13 are taken to be $f_7$, $f_8$ and $f_{13}$, respectively.

FIG. 7 is a schematic diagram that illustrates the disposition of lenses and trajectory of electron beams when using an objective lens with a long focus. The conditions for simultaneously correcting a spherical aberration and a coma aberration in a configuration that implements an aberration correction function for a long focus are:

i) that the axial trajectory 15 intersects with the optical axis between the rotationally symmetric lenses 7 and 8 and does not intersect with the optical axis between the objective lens 6 and the rotationally symmetric lens 7; and
ii) that the off-axis trajectory 17 does not intersect with the optical axis between the rotationally symmetric lenses 7 and 8.

Accordingly, it is necessary to satisfy the following conditional expressions:

[Expression 2]

$$f_{OL}^2 + f_{OL}l_5 - l_{OL}l_5 > 0 \quad (2)$$

$$f_7 < \frac{f_{OL}l_{OL}(l_3 - f_8)}{(l_3 - f_8)(l_{OL} - f_{OL}) + f_{OL}l_{OL}} \quad (3)$$

$$f_8 < l_3 \quad (4)$$

$$f_7 > \frac{l_5(l_3 + l_4)}{l_3 + l_4 + l_5} \quad (5)$$

$$f_8 > \frac{l_4(l_3 + l_5)}{l_3 + l_4 + l_5} \quad (6)$$

Here, expression (2) is a condition that the axial trajectory 15 does not intersect with the optical axis between the objective lens 6 and the rotationally symmetric lens 7, expressions (3) and (4) are conditions that the axial trajectory 15 intersects with the optical axis between the rotationally symmetric lenses 7 and 8, and expressions (5) and (6) are conditions that the off-axis trajectory 17 does not intersect with the optical axis between the rotationally symmetric lenses 7 and 8.

Further, FIG. 8 is a schematic diagram that shows the disposition of lenses and trajectory of electron beams in the case of using the objective lens 6 with a short focus, and is approximately the same as FIG. 4. The conditions for simultaneously correcting a spherical aberration and a coma aberration in a configuration that implements an aberration correction function for a short focus are:

iii) similarly to the aberration correction for a long focus, that the axial trajectory 10 intersects with the optical axis between the rotationally symmetric lenses 13 and 8 and does not intersect with the optical axis between the objective lens 6 and the rotationally symmetric lens 13; and
iv) that the off-axis trajectory 12 does not intersect with the optical axis between the rotationally symmetric lenses 13 and 8.

Accordingly, it is necessary to satisfy the following conditions:

[Expression 3]

$$f_{OS}^2 + f_{OS}l_1 - l_{OS}l_1 > 0 \quad (7)$$

$$f_{13} < \frac{f_{OS}l_{OS}(l_2 + l_3 - f_8)}{(l_2 + l_3 - f_8)(l_{OS} - f_{OS}) + f_{OS}l_{OS}} \quad (8)$$

$$f_8 < l_2 + l_3 \quad (9)$$

$$f_{13} > \frac{l_1(l_2 + l_3 + l_4)}{l_1 + l_2 + l_3 + l_4} \quad (10)$$

$$f_8 > \frac{l_4(l_1 + l_2 + l_3)}{l_1 + l_2 + l_3 + l_4} \quad (11)$$

Here, expression (7) is a condition that the axial trajectory 10 does not intersect with the optical axis between the objective lens 6 and the rotationally symmetric lens 13, expressions (8) and (9) are conditions that the axial trajectory 10 intersects with the optical axis between the rotationally symmetric lenses 13 and 8, and expressions (10) and (11) are conditions that the off-axis trajectory 12 does not intersect with the optical axis between the rotationally symmetric lenses 13 and 8. In this condition, if expression (4) is satisfied, expression (9) can be omitted.

Hence, by satisfying the conditions shown in expression (2) to expression (11), an aberration can be corrected in both a case in which the objective lens 6 is used with a long focus and a case in which the objective lens 6 is used with a short focus. Since there are many solutions for satisfying the conditions shown in expression (2) to expression (11), when actually deciding the positions of the rotationally symmetric lenses 13, 7, and 8, a solution that decreases the focal lengths of the rotationally symmetric lenses as much as possible is used. This is done to reduce the influence of a chromatic aberration. In this case, the term "chromatic aberration" refers to an aberration that is a problem after a spherical aberration and a coma aberration, and which is not adequately corrected only by satisfying the above described conditions. Since a chromatic aberration is roughly proportional to the focal lengths of the lenses, it is desirable to decrease the focal lengths of the lenses to reduce the influence of the chromatic aberration. However, there is a limit to decreasing the focal lengths of the lenses based on the conditions of expressions (5), (6), (10) and (11). Hence, it is sufficient to adopt a configuration that reduces the focal length of each lens as much as possible in a solution that satisfies the conditions according to expressions (2) to (11). In this connection, since there are also limits to the mechanical structure, it is necessary to decide the optimal conditions while taking those limits into consideration.

<Countermeasures for Structural Problems>

In the case of incorporating the correction apparatus 1 into an electron microscope, there is the problem that the height of the electron microscope itself increases and the electron microscope becomes structurally unstable. It is therefore desirable to make the correction apparatus 1 as small as possible. With regard to the area between the multipole lenses 2 and 3 that is the latter half portion of the correction apparatus 1, by deciding the focal length f of the rotationally symmetric lenses 4 and 5, the distance between the lenses is also decided. In consideration of the aforementioned chromatic aberration and structural problem, it is better to make the focal length f of the rotationally symmetric lenses 4 and 5 as short as possible.

However, since the excitation required for the multipole lenses 2 and 3 and the rotationally symmetric lenses 4 and 5 is decided according to the accelerating voltage of the electron microscope and the correction amount for a spherical aberration of the objective lens, and because there are also structural problems at the time of manufacture, there is a limit to the extent to which the focal length f of the rotationally symmetric lenses 4 and 5 can be shortened.

Regarding the area between the objective lens 6 and the multipole lens 2 that is the front half portion of the correction apparatus 1, the focal lengths of the rotationally symmetric lenses 7, 8, and 13 and the distance between each lens are adjusted so as to satisfy the spherical aberration correction condition and the coma-free plane transfer condition. At this time, several solutions regarding the focal lengths of the rotationally symmetric lenses and the distance between each lens are available for simultaneously satisfying both the spherical aberration correction condition and the coma-free plane transfer condition. Although, as described above, the focal lengths of the rotationally symmetric lenses and the distance between each lens is decided so that the chromatic aberration decreases, it is also desirable to control the overall length of the correction apparatus 1 to achieve a short length.

When using the objective lens 6 with a long focus, the position of the rotationally symmetric lens 7 is restricted to a certain degree by the focal length of the objective lens 6. Further, due to structural problems, the distance from the objective lens 6 to the multipole lens 2 is restricted. It is therefore sufficient to decide the positions of the three rotationally symmetric lenses according to the following procedure.

First, decide the distance from the objective lens 6 to the multipole lens 2 such that there is no structural difficulty. Next, decide the focal length of the objective lens 6 at the time of use with a long focus based on the relationship with the specimen position 14, and dispose the rotationally symmetric lens 7 at a position at a length that is longer than the focal length of the objective lens 6. Subsequently, adjust the focal lengths and positions of the rotationally symmetric lenses 7 and 8 so as to correct an aberration in a case in which the objective lens 6 is used with a long focus. At this time, adjust the focal lengths and positions of the rotationally symmetric lenses 7 and 8 so as to reduce the chromatic aberration while satisfying the spherical aberration correction condition and the coma-free plane transfer condition (above described conditions i) and ii), expressions (2) to (6)). Finally, adjust the position and focal length of the rotationally symmetric lens 13 and the focal length of the rotationally symmetric lens 8 so as to satisfy the aberration correction condition when using the objective lens 6 with a short focus. The position of the rotationally symmetric lens 8 at this time is the same as in the case of the long focus that was decided earlier. Decide the conditions of the rotationally symmetric lens 8 and 13 so as to simultaneously satisfy the spherical aberration correction condition and the coma-free plane transfer condition (above described conditions iii) and iv), expressions (7) to (11)) and also reduce a chromatic aberration.

It is desirable to use the values decided at the design stage for a long focus and a short focus, respectively, with respect to the focal length of the objective lens. However, in the case of using a value that is different to a value decided at the design stage for the focal length of the objective lens because of a change in the specimen position or a magnification change, according to the present configuration the spherical aberration correction condition and coma-free plane transfer condition can be satisfied by changing the focal length without changing the positions of the rotationally symmetric lenses 7, 8, and 13.

<Application to Transmission Electron Microscope>

Figure 9:
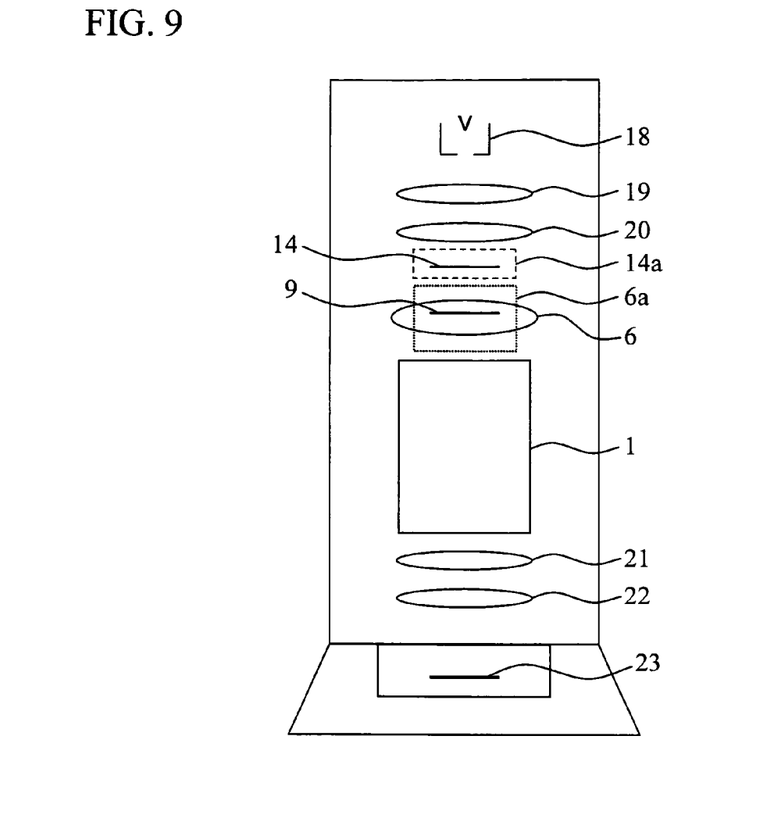
FIG. 9 is a configuration diagram of a transmission electron microscope (TEM) including the aberration correction apparatus of the present invention.

FIG. 9 is a view that illustrates a configuration in a case in which the aberration correction apparatus according to an embodiment of the present invention is incorporated into a transmission electron microscope (TEM). After the beam current amount of electron beams discharged from an electron source 18 is adjusted by converging lenses 19 and 20, the electron beams are irradiated under suitable conditions onto the specimen position 9 in the case of high resolution observation or onto the specimen position 14 in the case of magnetic observation or the like. The electron beams 18 are transmitted through the specimen, the transmission image is enlarged by the objective lens 6, and an aberration is corrected by the correction apparatus 1. Thereafter, the transmission image is further enlarged by projection lenses 21 and 22 and projected onto a fluorescent screen 23.

The distance of the specimen position 14 from the objective lens 6 is decided according to the size of a specimen space 14a. Further, when performing magnetic observation of a specimen, the specimen position 14 must be provided at a position that is farther from the objective lens 6 than the area of influence of the magnetic field of the objective lens 6. Although the spherical aberration of the objective lens increases in accordance with an increase in the focal length of the objective lens, the spherical aberration can also be corrected by the aberration correction apparatus for a long focus when the objective lens uses a long focal length. However, when correcting a large spherical aberration, it is necessary to increase the strength of a hexapole field that corrects the spherical aberration, and since the correction apparatus 1 increases in size in this case, it is desirable to make the distance between the specimen position 14 and the objective lens 6 as small as possible. It is therefore better to make the specimen space 14a as small as possible.

<Example of Electron Lens Control Configuration>

Figure 10:
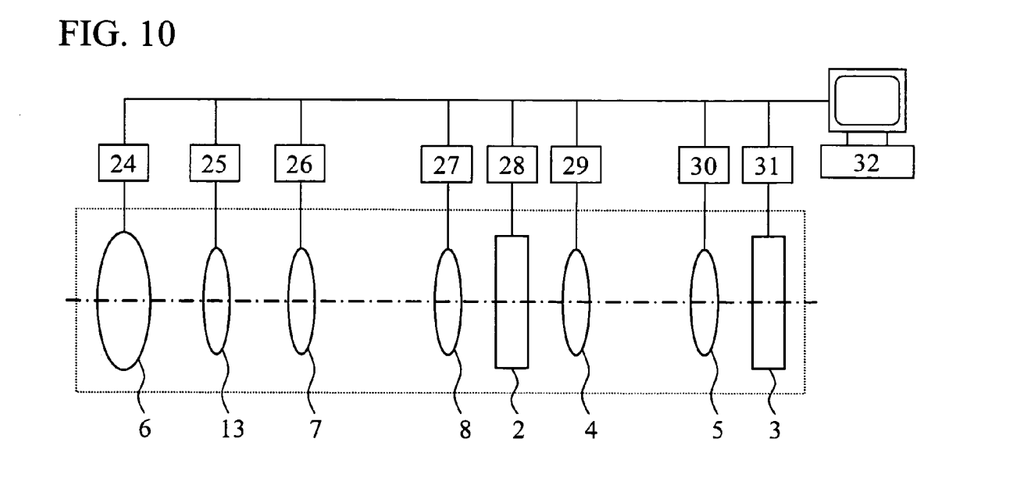
FIG. 10 is a view that illustrates a configuration for controlling each lens of the aberration correction apparatus of the present invention.

FIG. 10 is a view that illustrates a configuration for controlling each electron lens (current sources 24 to 31 of objective lens, rotationally symmetric lenses, and multipole lenses) comprising the aberration correction apparatus of the present invention using a computing machine 32 such as a personal computer.

In FIG. 10, the computing machine 32 calculates current values that satisfy the aforementioned aberration correction conditions, and corrects an aberration by sending the appropriate signals to the respective current sources 24 to 31. The computing machine 32 includes a display unit, and an operator can check the status of the apparatus by viewing the display unit.

With the configuration shown in FIG. 10, by inputting an instruction, an operator can select a mode to switch between an aberration correction for a long focus and an aberration correction for a short focus and switch the lenses to be used. The method of correcting a spherical aberration is the same for both a long focus and a short focus, and a spherical aberration that occurs at hexapole fields is controlled by adjusting the strength of the hexapole fields by changing the excitation of the multipole lenses 2 and 3 using the current sources 28 and 31.

To correct an axial coma aberration of an objective lens in the case of a long focus, the excitation of the rotationally symmetric lenses 7 and 8 is changed by the current sources 26 and 27 to cancel out the axial coma aberration of the objective lens with the axial coma aberration of the rotationally symmetric lenses 7 and 8, so that it appears like the coma-free plane of the objective lens 6 is transferred to the center of the multipole lens 2.

In the case of a short focus, the excitation of the rotationally symmetric lenses 13 and 8 is changed using the current sources 25 and 27 to cancel out the axial coma aberration of the objective lens with the axial coma aberration of the rotationally symmetric lenses 13 and 8, so that, similarly to the case of a long focus, it appears like the coma-free plane of the objective lens is transferred.

What is claimed is:

1. An aberration correction apparatus for correcting an aberration of an objective lens in a charged particle beam apparatus, comprising:
   a first multipole lens that is arranged on the objective lens side;
   a second multipole lens that is arranged on a projection lens side;
   a first transfer lens group for transferring a coma-free condition of the objective lens to the second multipole lens, that is arranged between the first multipole lens and the second multipole lens; and
   a second transfer lens group for transferring a coma-free condition of the objective lens to the first multipole lens, that is arranged between the first multipole lens and the objective lens;
   wherein the second transfer lens group includes three rotationally symmetric lenses, and when the three rotationally symmetric lenses are defined as a first, a second, and a third rotationally symmetric lens in order of proximity to the objective lens, it is possible to correct an aberration of the objective lens in a case in which a focus of the objective lens is inside or outside the objective lens by using the second transfer lens group while switching between a combination of the third rotationally symmetric lens and the first rotationally symmetric lens and a combination of the third rotationally symmetric lens and the second rotationally symmetric lens.

2. The aberration correction apparatus according to claim 1, wherein:
   in a case in which a focus of the objective lens is outside the objective lens (when the objective lens uses a long focus), an aberration correction of the objective lens is performed using a combination of the second and third rotationally symmetric lenses; and
   in a case in which a focus of the objective lens is inside the objective lens (when the objective lens uses a short focus), an aberration correction of the objective lens is performed using a combination of the first and third rotationally symmetric lenses.

3. The aberration correction apparatus according to claim 2, wherein:
   when the objective lens uses a long focus, conditions that enable an aberration correction of the objective lens are that an axial trajectory intersects with an optical axis between the second and third rotationally symmetric lenses without the axial trajectory intersecting with the optical axis between the objective lens and the second rotationally symmetric lens, and an off-axis trajectory does not intersect with the optical axis between the second and third rotationally symmetric lenses; and
   when the objective lens uses a short focus, conditions that enable an aberration correction of the objective lens are that an axial trajectory intersects with an optical axis between the first and third rotationally symmetric lenses without the axial trajectory intersecting with the optical axis between the objective lens and the first rotationally symmetric lens, and an off-axis trajectory does not intersect with the optical axis between the first and the third rotationally symmetric lenses.

4. The aberration correction apparatus according to claim 3, wherein, when it is assumed that:
   in a case in which the objective lens uses a long focus, a length between a principal plane and a coma-free plane of the objective lens is $f_{OL}$, and a length between the specimen and the principal plane of the objective lens is $l_{OL}$;
   in a case in which the objective lens uses a short focus, a length between a principal plane and a coma-free plane of the objective lens is $f_{OS}$, and a length between the specimen and the principal plane of the objective lens is $l_{OS}$;
   in a case in which the objective lens uses a long focus, a length between a coma-free plane and the first rotationally symmetric lens is $l_5$, a length between the first and the second rotationally symmetric lenses is $l_2$, a length between the second and the third rotationally symmetric lenses is $l_3$, and a length between the third rotationally symmetric lens and the first multipole lens is $l_4$; and
   focal lengths of the first, second, and third rotationally symmetric lens are $f_7$, $f_8$, and $f_{13}$, respectively;
   conditions that enable the aberration correction in a case in which the objective lens uses a long focus are:

[Expression 1]

$$f_{OL}^2 + f_{OL}l_5 - l_{OL}l_5 > 0$$

$$f_7 < \frac{f_{OL}l_{OL}(l_3 - f_8)}{(l_3 - f_8)(l_{OL} - f_{OL}) + f_{OL}l_{OL}}$$

$$f_8 < l_3$$

$$f_7 > \frac{l_5(l_3 + l_4)}{l_3 + l_4 + l_5}$$

$$f_8 > \frac{l_4(l_3 + l_5)}{l_3 + l_4 + l_5}$$

and conditions that enable the aberration correction in a case in which the objective lens uses a short focus are:

[Expression 2]

$$f_{OS}^2 + f_{OS}l_1 - l_{OS}l_1 > 0$$

$$f_{13} < \frac{f_{OS}l_{OS}(l_2 + l_3 - f_8)}{(l_2 + l_3 - f_8)(l_{OS} - f_{OS}) + f_{OS}l_{OS}}$$

$$f_8 < l_2 + l_3$$

$$f_{13} > \frac{l_1(l_2 + l_3 + l_4)}{l_1 + l_2 + l_3 + l_4}$$

$$f_8 > \frac{l_4(l_1 + l_2 + l_3)}{l_1 + l_2 + l_3 + l_4}.$$

5. A charged particle apparatus that irradiates a charged particle beam at a specimen to acquire a specimen image and perform observation of the specimen, comprising:
   an electron source that generates the charged particle beam;
   a converging lens for converging the charged particle beam and irradiating the converged beam at the specimen;
   an objective lens for enlarging an image that is transmitted through the specimen; and
   an aberration correction apparatus for correcting an aberration of the objective lens;
   wherein the aberration correction apparatus comprises:
   a first multipole lens that is arranged on the objective lens side;
   a second multipole lens that is arranged on a projection lens side;
   a first transfer lens group for transferring a coma-free condition of the objective lens to the second multipole lens, that is arranged between the first multipole lens and the second multipole lens; and a second transfer lens group for transferring a coma-free condition of the objective lens to the first multipole lens, that is arranged between the first multipole lens and the objective lens;

wherein the second transfer lens group includes three rotationally symmetric lenses, and when the three rotationally symmetric lenses are defined as a first, a second, and a third rotationally symmetric lens in order of proximity to the objective lens, it is possible to correct an aberration of the objective lens in a case in which a focus of the objective lens is inside or outside the objective lens by using the second transfer lens group while switching between a combination of the third rotationally symmetric lens and the first rotationally symmetric lens and a combination of the third rotationally symmetric lens and the second rotationally symmetric lens.

6. The charged particle apparatus according to claim 5, wherein:

in a case in which a focus of the objective lens is outside the objective lens (when the objective lens uses a long focus), an aberration correction of the objective lens is performed using a combination of the second and third rotationally symmetric lenses; and in a case in which a focus of the objective lens is inside the objective lens (when the objective lens uses a short focus), an aberration correction of the objective lens is performed using a combination of the first and third rotationally symmetric lenses.

7. The charged particle apparatus according to claim 6, wherein:

when the objective lens uses a long focus, conditions that enable an aberration correction of the objective lens are that an axial trajectory intersects with an optical axis between the second and third rotationally symmetric lenses without the axial trajectory intersecting with the optical axis between the objective lens and the second rotationally symmetric lens, and an off-axis trajectory does not intersect with the optical axis between the second and third rotationally symmetric lenses; and when the objective lens uses a short focus, conditions that enable an aberration correction of the objective lens are that an axial trajectory intersects with an optical axis between the first and third rotationally symmetric lenses without the axial trajectory intersecting with the optical axis between the objective lens and the first rotationally symmetric lens, and an off-axis trajectory does not intersect with the optical axis between the first and the third rotationally symmetric lenses.

8. The charged particle apparatus according to claim 7, wherein, when it is assumed that:

in a case in which the objective lens uses a long focus, a length between a principal plane and a coma-free plane of the objective lens is $f_{OL}$, and a length between the specimen and the principal plane of the objective lens is $l_{OL}$;

in a case in which the objective lens uses a short focus, a length between a principal plane and a coma-free plane of the objective lens is $f_{OS}$, and a length between the specimen and the principal plane of the objective lens is $l_{OS}$;

in a case in which the objective lens uses a long focus, a length between a coma-free plane and the first rotationally symmetric lens is $l_5$, a length between the first and the second rotationally symmetric lenses is $l_2$, a length between the second and the third rotationally symmetric lenses is $l_3$, and a length between the third rotationally symmetric lens and the first multipole lens is $l_4$; and focal lengths of the first, second, and third rotationally symmetric lens are $f_7$, $f_8$, and $f_{13}$, respectively;

conditions that enable the aberration correction in a case in which the objective lens uses a long focus are:

[Expression 3]

$$f_{OL}^2 + f_{OL}l_5 - l_{OL}l_5 > 0$$

$$f_7 < \frac{f_{OL}l_{OL}(l_3 - f_8)}{(l_3 - f_8)(l_{OL} - f_{OL}) + f_{OL}l_{OL}}$$

$$f_8 < l_3$$

$$f_7 > \frac{l_5(l_3 + l_4)}{l_3 + l_4 + l_5}$$

$$f_8 > \frac{l_4(l_3 + l_5)}{l_3 + l_4 + l_5}$$

and conditions that enable the aberration correction in a case in which the objective lens uses a short focus are:

[Expression 4]

$$f_{OS}^2 + f_{OS}l_1 - l_{OS}l_1 > 0$$

$$f_{13} < \frac{f_{OS}l_{OS}(l_2 + l_3 - f_8)}{(l_2 + l_3 - f_8)(l_{OS} - f_{OS}) + f_{OS}l_{OS}}$$

$$f_8 < l_2 + l_3$$

$$f_{13} > \frac{l_1(l_2 + l_3 + l_4)}{l_1 + l_2 + l_3 + l_4}$$

$$f_8 > \frac{l_4(l_1 + l_2 + l_3)}{l_1 + l_2 + l_3 + l_4}.$$

9. The charged particle apparatus according to claim 8, further comprising:

a controlling section which controls a current source of each of the rotationally symmetric lenses and the multipole lenses;

an inputting section which operates the controlling section; and a display device which displays an image of the specimen;

wherein, based on the conditions that enable the aberration correction, the controlling section calculates a current to be applied to each of the rotationally symmetric lenses and each of the multipole lenses, and controls each of the rotationally symmetric lenses and each of the multipole lenses.

* * * * *